(12) United States Patent
Hasegawa et al.

(10) Patent No.: US 10,980,160 B2
(45) Date of Patent: Apr. 13, 2021

(54) IMAGE PICKUP MODULE, METHOD FOR MANUFACTURING IMAGE PICKUP MODULE, AND ELECTRONIC DEVICE (71) Applicant: CANON KABUSHIKI KAISHA, Tokyo (JP)

(72) Inventors: Mitsutoshi Hasegawa, Yokohama (JP); Kunihiko Minegishi, Yokohama (JP); Takashi Sakaki, Inagi (JP); Yoshitomo Fujisawa, Kawasaki (JP); Shingo Ishiguri, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/578,951

(22) Filed: Sep. 23, 2019

(65) Prior Publication Data
US 2020/0100408 A1 Mar. 26, 2020

(30) Foreign Application Priority Data

Sep. 26, 2018 (JP) .............................. JP2018-180426
Jul. 30, 2019 (JP) .............................. JP2019-140174

(51) Int. Cl.
H04N 5/372 (2011.01)
H05K 13/04 (2006.01)
G03B 17/14 (2021.01)
H04N 5/369 (2011.01)
H04N 5/374 (2011.01)
G02B 13/00 (2006.01)

(52) U.S. Cl.
CPC ......... *H05K 13/0465* (2013.01); *G03B 17/14* (2013.01); *H04N 5/379* (2018.08); *G02B 13/001* (2013.01); *H04N 5/372* (2013.01); *H04N 5/374* (2013.01)

(58) Field of Classification Search
CPC .................................................. H05K 13/0465
USPC ......................................................... 348/294
See application file for complete search history.

(56) References Cited

U.S. PATENT DOCUMENTS

2003/0111728 A1* 6/2003 Thai ....................... H01L 24/49
257/735

FOREIGN PATENT DOCUMENTS

WO        2014-024338 A1     2/2014

* cited by examiner

Primary Examiner — Joel W Fosselman
(74) Attorney, Agent, or Firm — Canon U.S.A., Inc., IP Division

(57) ABSTRACT

An image pickup module includes a printed wiring board, an electronic component, solder, and a thermosetting resin. The printed wiring board has a first surface provided with first lands. The electronic component includes an image pickup element and has a second surface provided with second lands. The thermosetting resin is in contact with the solder and bonds the printed wiring board to the electronic component. The solder bonds the first lands to the second lands and has a hollow portion. The area of the hollow portion is 5% to 50% of the total area of the solder as observed from the electronic component side in a transmission mode using an X-ray.

35 Claims, 6 Drawing Sheets

IMAGE PICKUP MODULE, METHOD FOR MANUFACTURING IMAGE PICKUP MODULE, AND ELECTRONIC DEVICE

BACKGROUND OF THE INVENTION

Field of the Invention

The present disclosure relates to an image pickup module, a method for manufacturing the image pickup module, and an electronic device.

Description of the Related Art

An image pickup device such as a digital camera or a camera-equipped smartphone which is an example of an electronic device includes an image pickup module including an electronic component, such as an image sensor, mounted on a printed wiring board. As image pickup devices have been downsized and have been improved in performance, electronic components have been downsized and have been improved in performance. For electronic components for use in image pickup devices, semiconductor packages, such as land grid arrays (LGAs) and leadless chip carriers (LCCs), capable of being downsized and capable of arranging a large number of terminals are used. These electronic components include lands which serve as terminals and which are placed on a bottom face, need no lead terminals, and therefore enable image pickup modules to be downsized.

As electronic components have been improved in performance, the amount of heat generated during the operation of the electronic components has increased. A land of an electronic component and a land of a printed wiring board are soldered to each other. The electronic component is thermally expanded or is deformed by the heat generated during the operation of the electronic component. As a result, stress is applied to solder and the solder is broken in some cases. Solder is required to have not only resistance to heat but also resistance to drop impact.

International Publication No. 2014-024338 discloses a manufacturing method in which an electronic component is mounted on a printed wiring board using paste containing a solder powder and a thermosetting resin. This type of paste is separated into solder and an uncured thermosetting resin when being heated to a temperature not lower than the melting point of the solder. The uncured thermosetting resin is separated around the solder and is cured by a curing reaction by heating. Covering the solder with the cured thermosetting resin distributes the stress applied to the solder, thereby enabling the breakage of the solder to be suppressed.

However, in the conventional manufacturing method, a bond failure that pieces of solder are short-circuited has occurred in some cases.

SUMMARY OF THE INVENTION

An image pickup module includes a printed wiring board having a first surface provided with first lands; an electronic component which includes an image pickup element and which has a second surface, provided with second lands, facing the first surface; solder, bonding the first lands to the second lands, having a hollow portion; and a thermosetting resin, in contact with the solder, bonding the printed wiring board to the electronic component. The area of the hollow portion is 5% to 50% of the total area of the solder as observed from the electronic component side in a transmission mode using an X-ray.

A method for manufacturing an image pickup module including a printed wiring board having a first surface provided with first lands; an electronic component which includes an image pickup element and which has a second surface, provided with second lands, facing the first surface; solder, bonding the first lands to the second lands, having a hollow portion; and a thermosetting resin, in contact with the solder, bonding the printed wiring board to the electronic component includes a step of providing a solder paste containing a solder powder and a thermosetting resin on the first lands; a step of providing the electronic component on the printed wiring board such that the second lands are located on the first lands; a step of heating the solder paste to a peak temperature $T_p$ higher than the melting point $T_M$ of the solder powder such that the solder powder is melted and the thermosetting resin is separated from the solder paste; and a step of solidifying the solder by cooling the solder from the peak temperature $T_p$ to a temperature lower than the melting point $T_M$ of the solder powder before the thermosetting resin is cured and forming a hollow portion in the solder.

Further features of the present disclosure will become apparent from the following description of exemplary embodiments with reference to the attached drawings.

DESCRIPTION OF THE EMBODIMENTS

Image Pickup Module

Figure 1:
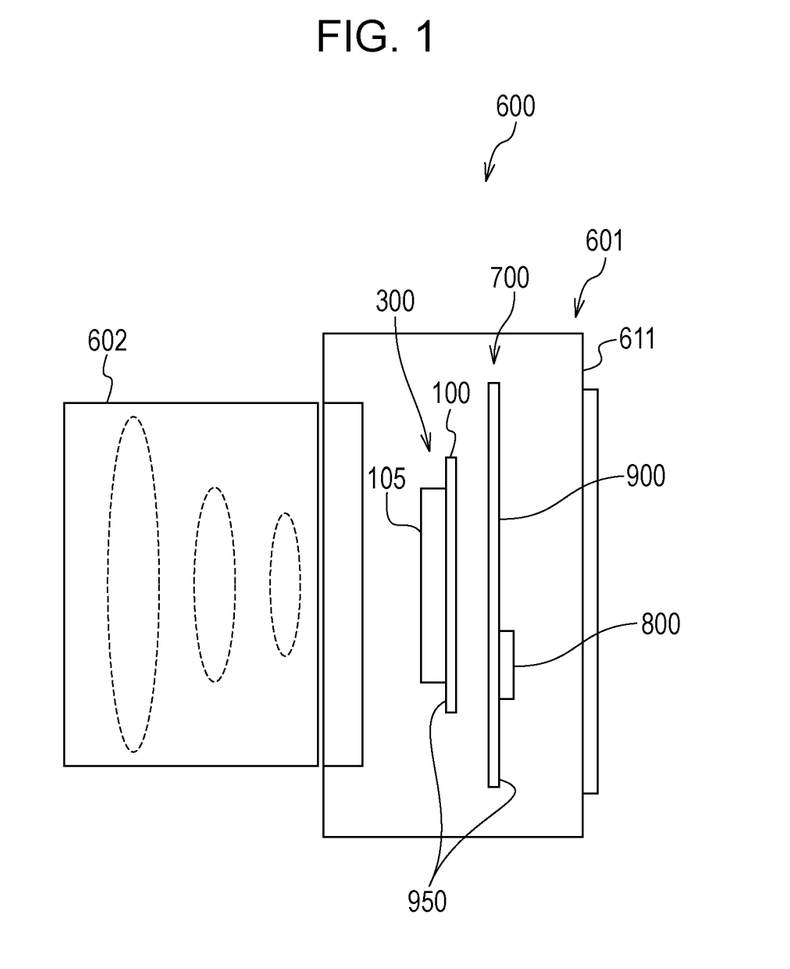
FIG. 1 is a schematic view of an electronic device according to an embodiment of the present disclosure.

FIG. 1 is a schematic view of a digital camera 600 which is an image pickup device cited as an example of an electronic device according to an embodiment of the present disclosure.

The digital camera 600, which is the image pickup device, is an interchangeable lens digital camera and includes a camera body 601 and a lens unit (lens barrel) 602, detachably mounted thereon, including lenses. The camera body 601 includes a housing 611, an image pickup module 300, and a printed circuit board 700, the image pickup module 300 and the printed circuit board 700 being placed in the housing 611. The image pickup module 300 and the printed circuit board 700 are electrically connected to each other with a cable 950.

The image pickup module 300 includes a semiconductor package equipped with an image sensor (image pickup element) which is an example of an electronic component 105 and also includes a printed wiring board 100 on which the electronic component 105 is mounted. The printed circuit board 700 includes an image processor 800 which is an example of an electronic component and a printed wiring board 900 on which the image processor 800 is mounted.

The image sensor (image pickup element) is, for example, a complementary metal oxide semiconductor (CMOS) image sensor or a charge-coupled device (CCD) image sensor. The image sensor has the function of converting light incident through the lens unit 602 into an electric signal.

The image processor 800 is, for example, a digital signal processor. The image processor 800 has the function of acquiring an electric signal from the image sensor, correcting the acquired electric signal, and generating image data.

Figure 2A:
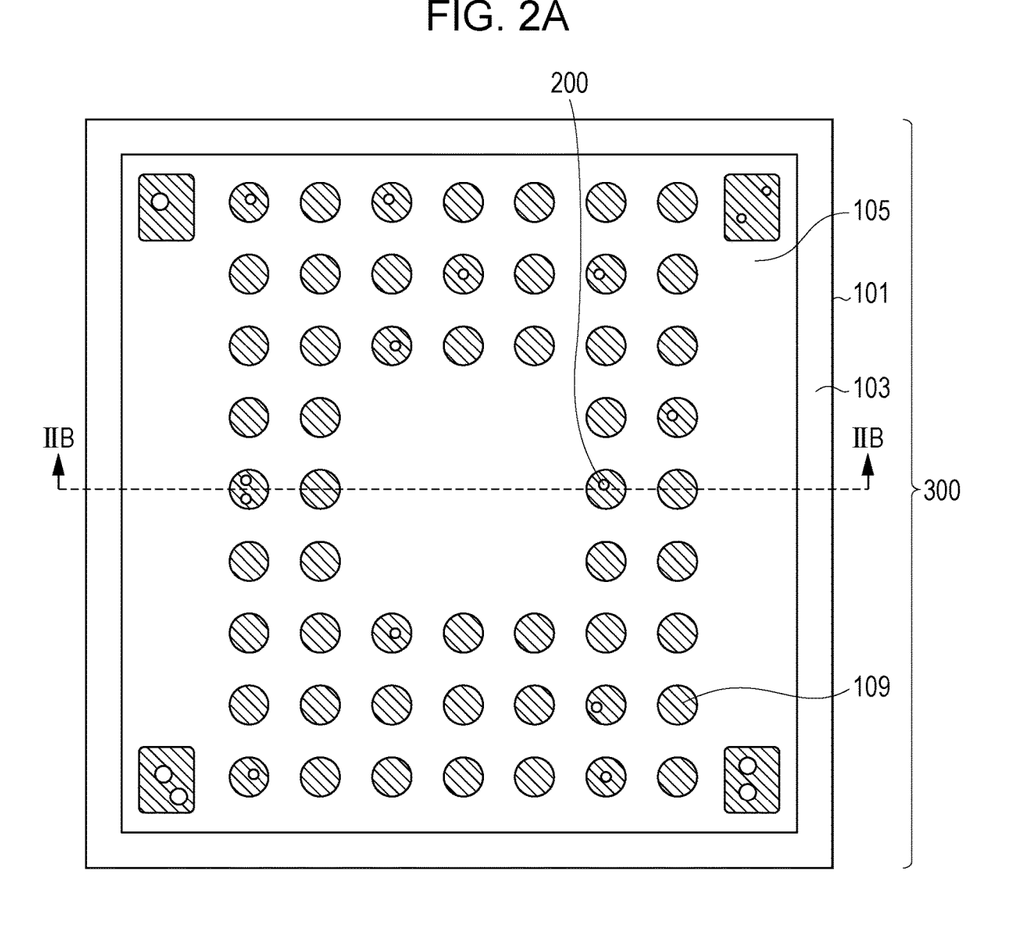
FIG. 2A is a projected view of the image pickup module, shown in FIG. 1, observed from the upper surface thereof in a transmission mode.
Figure 2B:
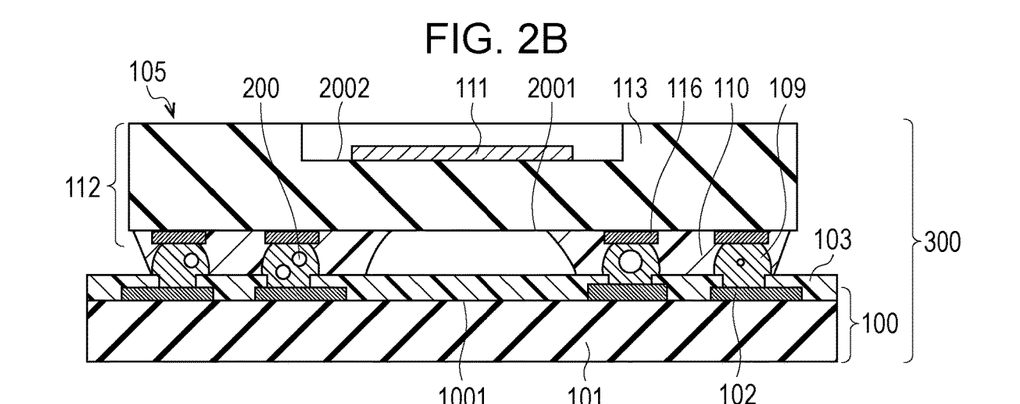
FIG. 2B is a sectional view of the image pickup module taken along the line IIB-IIB of FIG. 2A.

FIG. 2 is a schematic view of the image pickup module 300. FIG. 2A is a projected view of the image pickup module 300 observed from the upper surface thereof in a transmission mode. FIG. 2B is a sectional view of the image pickup module 300 taken along the line IIB-IIB of FIG. 2A.

The image pickup module 300 includes the electronic component 105 and the printed wiring board 100, on which the electronic component 105 is mounted. The electronic component 105 and the printed wiring board 100 are bonded to each other with solders 109 and a thermosetting resin 110.

The electronic component 105 is an LGA package. The electronic component 105 includes an image pickup element 111 and a package board 112 on which the image pickup element 111 is mounted. The package board 112 includes an insulating substrate 113 and a plurality of second lands 116 placed on a second surface 2001 of the insulating substrate 113. The image pickup element 111 is placed on a surface 2002 of the insulating substrate 113 that is opposite to the second surface 2001. The second lands 116 are electrodes made of, for example, a conductive metal such as copper and serve as, for example, signal electrodes, power supply electrodes, ground electrodes, or dummy electrodes. The insulating substrate 113 is, for example, a ceramic substrate made of ceramic such as alumina. The second surface 2001 has an area of, for example, 900 mm$^2$ or more and therefore the electronic component 105 is a relatively large electronic component. The electronic component 105 may be a BGA package.

The printed wiring board 100 includes an insulating substrate 101 and a plurality of first lands 102 placed on a first surface 1001 of the insulating substrate 101. The first lands 102 are electrodes made of, for example, a conductive metal such as copper and serve as, for example, signal electrodes, power supply electrodes, ground electrodes, or dummy electrodes. The insulating substrate 101 is a rigid substrate made of an insulating material such as an epoxy resin.

The first surface 1001 of the printed wiring board 100 is overlaid with a solder resist 103. The solder resist 103 is provided with openings at positions corresponding to the first lands 102. The first surface 1001 of the printed wiring board 100 and the second surface 2001 of the insulating substrate 113 face each other.

The second lands 116 are electrically and mechanically connected to the first lands 102 with the solders 109. The first lands 102 are bonded to the second lands 116 with the solders 109 through the openings of the solder resist 103.

Each solder 109 includes a hollow portion 200. That is, the solder 109 contains a void. The percentage of the hollow portion 200 in the solder 109 is 5% by area to 50% by area with respect to the total area of the solder 109 in a case where the image pickup module 300 is observed from the electronic component 105 side in a transmission mode using an X-ray. Setting the percentage of the hollow portion 200 within the above range enables the solder 109 to have good resistance to drop impact. Since the hollow portion 200 is a gas atmosphere, the elastic modulus of the hollow portion 200 is 0.3 MPa and is four orders of magnitude less than the elastic modulus of the solder 109 that is 33 GPa. Therefore, when the solder 109 contains 5% by area or more of the void, an inner wall surface of the solder 109 that is in contact with the hollow portion 200 is likely to be deformed. Therefore, even if external stress such as drop impact is applied to the solder 109, the external stress is absorbed by the inner wall surface of the solder 109 and cracks are unlikely to be caused in the solder 109. However, when the hollow portion 200 accounts for more than 50% by area of the total area of the solder 109, mechanical and/or electrical connection failures are caused between the second lands 116 and the first lands 102. The hollow portion 200 preferably accounts for 5% by area to 25% by area of the total area of the solder 109.

The length Lv of the hollow portion 200 is preferably 50% or less of the maximum length Ls of the solder 109 in a case where the image pickup module 300 is observed from the electronic component 105 side in a transmission mode using an X-ray. That is, the length Lv of the hollow portion 200 and the maximum length Ls of the solder 109 preferably satisfy the relation Lv/Ls≤50%. When the length Lv of the hollow portion 200 is greater than 50% of the maximum length Ls of the solder 109, mechanical and/or electrical connection failures are caused between the second lands 116 and the first lands 102. The length Lv of the hollow portion 200 is preferably 8% or more of the maximum length Ls of the solder 109. When the length Lv of the hollow portion 200 is 8% or more of the maximum length Ls of the solder 109, the inner wall surface of the solder 109 that is in contact with the hollow portion 200 is more likely to be deformed. Therefore, even if external stress such as drop impact is applied to the solder 109, the external stress is absorbed by the inner wall surface of the solder 109 and cracks are unlikely to be caused in the solder 109. The length Lv of the hollow portion 200 is more preferably 10% to 40% of the maximum length Ls of the solder 109. The length Lv of the hollow portion 200 is preferably 0.08 mm to 0.5 mm.

When the grain size of the solder 109 is small, sufficient bond strength can be obtained. From the viewpoint of obtaining increased bond strength, the grain size of the solder 109 is preferably 3 μm to 12 μm in terms of number-average equivalent circle diameter.

A surface (side surface) of the solder 109 that is connected to no land is in contact with the thermosetting resin 110. Covering the side surface of the solder 109 with the thermosetting resin 110 enables the thermal stress caused by the heat generated during the operation of the image pickup module 300 to be distributed not only in the solder 109 but also in the thermosetting resin 110. In this embodiment, a plurality of the solders 109 are collectively covered by the thermosetting resin 110. A plurality of the solders 109 are preferably collectively covered by the thermosetting resin 110, are not limited to this, and may be covered by a plurality of separated pieces of the thermosetting resin 110. The thermosetting resin 110 preferably has a Vickers hardness of 17 Hv or more. When the Vickers hardness thereof is 17 Hv or more, the bond strength is sufficient.

When the grain size of the solders 109 and the Vickers hardness of the thermosetting resin 110 satisfy the above ranges, the breakage of the solders 109 by thermal stress can be suppressed even if a large electronic component such as the electronic component 105, in which the area of the second surface 2001 is 900 mm$^2$ or more, is mounted.

Method For Manufacturing Image Pickup Module

The manufacturing method disclosed in International Publication No. 2014-024338 includes a step of melting solder and curing a thermosetting resin. The inventor has found that this step causes a bond failure that pieces of solder are short-circuited.

The manufacturing method is described below in detail. Since the manufacturing method includes the step of melting the solder and curing the thermosetting resin, when a solder powder in a solder paste is melted, an oxide film covering the solder powder is reduced by flux contained in the solder paste and is removed, pieces of the solder are aggregated, and gas such as carbon dioxide is generated. The generated gas forms voids in the molten solder and seeks to escape from the solder into air. However, the thermosetting resin that has begun to be cured is present around the solder and therefore the gas cannot readily escape and the voids are expanded. The expanded voids cut through a thin portion of the cured thermosetting resin and the gas escapes into air. On this occasion, the molten solder flows out to come into contact with adjacent pieces of the solder, so that a bond failure that the solder pieces are short-circuited occurs. In the present disclosure, an appropriate amount of gas generated in a manufacturing process is confined in solder and a hollow portion is formed in the solder. Therefore, the gas generated in the manufacturing process does not diffuse in any thermosetting resin; hence, an image pickup module in which no pieces of solder are short-circuited can be provided.

FIGS. 3A to 3F are schematic views illustrating a method for manufacturing the image pickup module 300 according to an embodiment of the present disclosure.

Figure 3A:
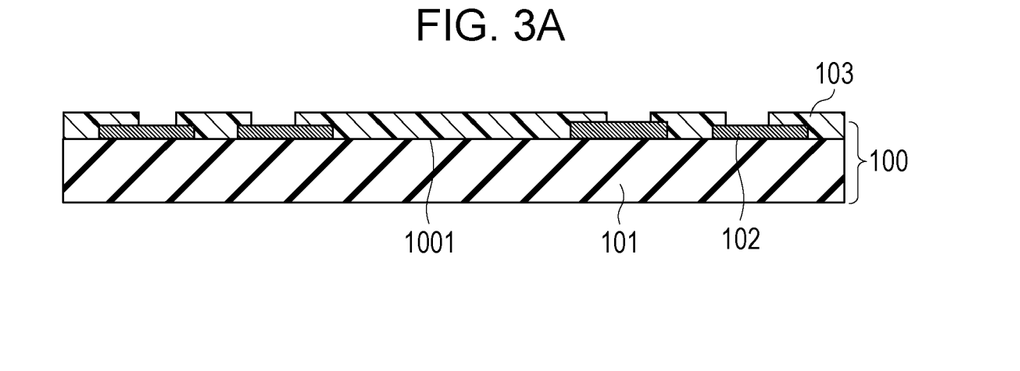
FIG. 3A is a schematic view illustrating a method for manufacturing the image pickup module shown in FIG. 1.

FIG. 3A shows the printed wiring board 100 provided with no solder paste. The printed wiring board 100 includes the insulating substrate 101 and the first lands 102, which are placed on the first surface 1001 of the insulating substrate 101. The first lands 102 are electrodes made of, for example, a conductive metal such as copper and serve as, for example, signal electrode, power supply electrodes, ground electrodes, or dummy electrodes. The insulating substrate 101 is a rigid substrate made of an insulating material such as an epoxy resin. The first surface 1001 is overlaid with the solder resist 103. The solder resist 103 is provided with openings at positions corresponding to the first lands 102. The shape of the first lands 102 may be angular or round and a relationship with the solder resist 103 may be SMD or NSMD.

Figure 3B:
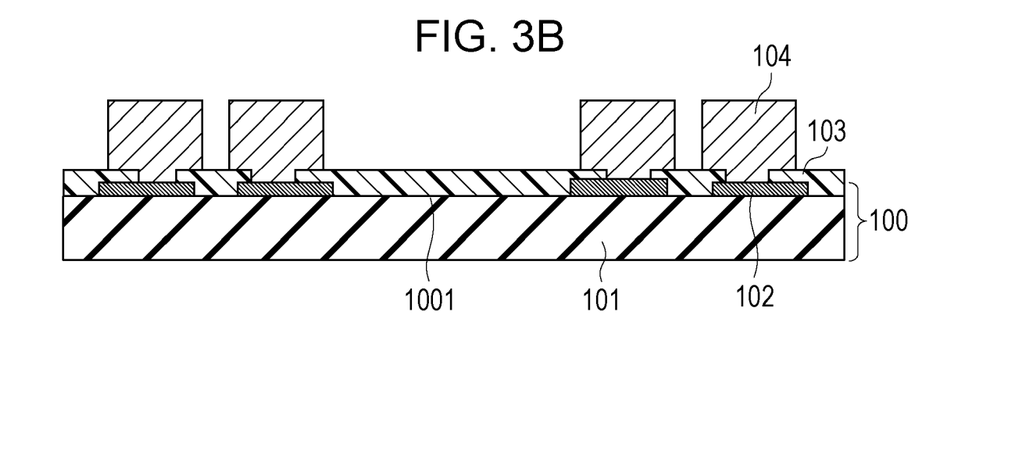
FIG. 3B is a schematic view illustrating the method for manufacturing the image pickup module shown in FIG. 1.

FIG. 3B shows a step of providing a solder paste 104 containing a solder powder and a thermosetting resin on the first lands 102. The solder paste 104 can be provided by, for example, screen printing or with a dispenser. The solder paste 104 may be provided so as to completely cover the first lands 102 as shown in FIG. 3B or may be provided so as to partly cover the first lands 102 like so-called offset printing.

The solder paste 104 contains at least the solder powder and the thermosetting resin. The solder paste 104 may further contain a flux component necessary for soldering. The solder paste 104, as well as a solder paste containing no thermosetting resin, can be provided by screen printing or with a dispenser and can be used for soldering by heating such as reflowing.

After the heating of the solder paste 104 is started, the solder powder is melted and the thermosetting resin is separated. The thermosetting resin comes into contact with a surface of solder that is connected to no land and is cured. The cured thermosetting resin bonds the electronic component 105 to the printed wiring board 100 together with solder and therefore functions as a so-called reinforcing resin. Therefore, the bond reliability of the image pickup module 300 can be enhanced.

Figure 3C:
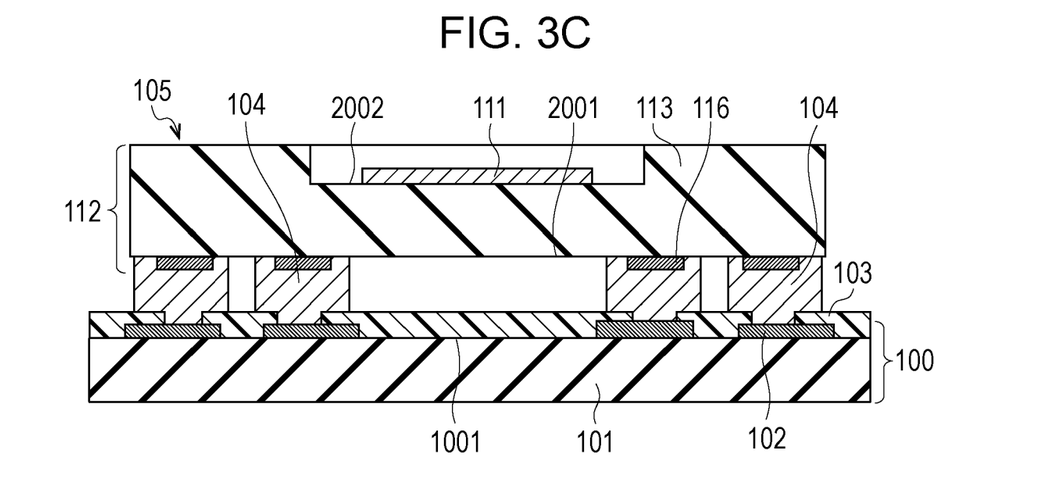
FIG. 3C is a schematic view illustrating the method for manufacturing the image pickup module shown in FIG. 1.

FIG. 3C shows a step of providing the electronic component 105 on the printed wiring board 100 provided with the solder paste 104. The electronic component 105 is provided on the printed wiring board 100 using a mounter or the like. As shown in FIG. 3C, the second lands 116 are placed on the second surface 2001 of the insulating substrate 113 so as to correspond to the first lands 102. The electronic component 105 is placed such that each of the second lands 116 is located on a corresponding one of the first lands 102.

Figure 3D:
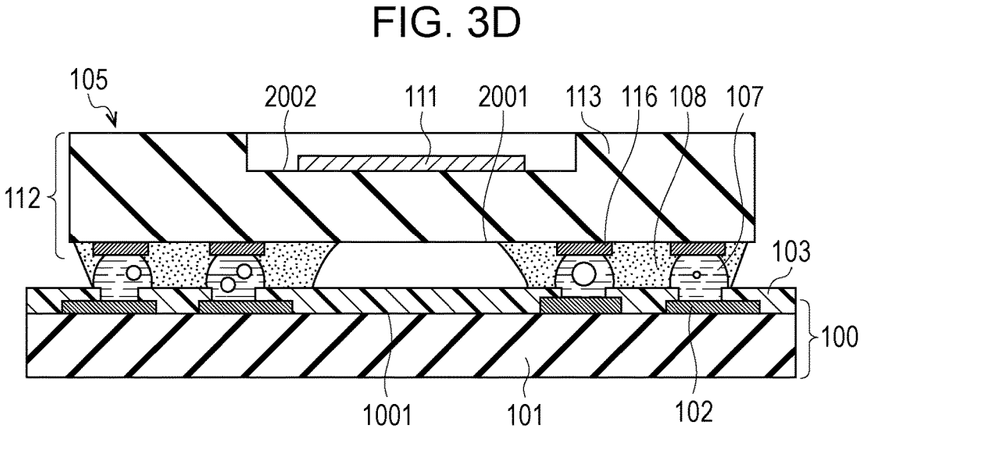
FIG. 3D is a schematic view illustrating the method for manufacturing the image pickup module shown in FIG. 1.

FIG. 3D shows a step of separating the thermosetting resin from the solder paste 104 in such a manner that the solder paste 104 is heated to a peak temperature $T_p$ higher than the melting point $T_M$ of the solder powder such that the solder powder is melted and is aggregated. Reference numeral 107 represents solder in a liquid state. Reference numeral 108 represents the uncured thermosetting resin in substantially a liquid state. The uncured thermosetting resin 108 is affected by the solder 107, which are in a liquid state, and is in a state that the degree of cure is sufficiently low. When the solder powder is melted and is aggregated, gas such as carbon dioxide is generated and forms voids. The formed voids continue to expand up to the peak temperature $T_p$. The peak temperature $T_p$ is not particularly limited and may be appropriately set. However, the peak temperature $T_p$ is extremely higher than the melting point $T_M$ of the solder powder, the cure of the thermosetting resin may possibly proceed extremely.

Figure 3E:
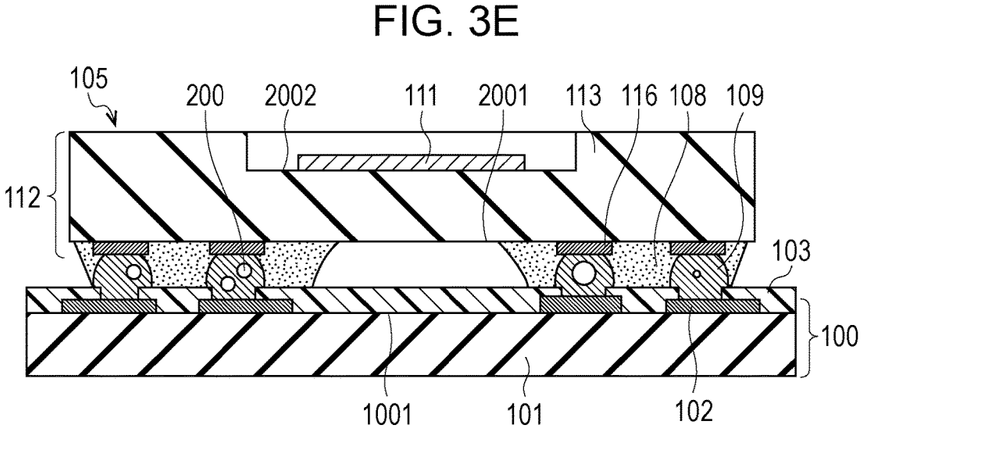
FIG. 3E is a schematic view illustrating the method for manufacturing the image pickup module shown in FIG. 1.

FIG. 3E shows a step of solidifying the molten solder 107 by cooling the molten solder 107, which are in a liquid state, from the peak temperature $T_p$ to a temperature lower than the melting point $T_M$ of the solder powder. Solidifying the molten solder 107 allows the electronic component 105 and the printed wiring board 100 to be electrically and mechanically bonded to each other. In this step, the solders 109 are solidified and become solid. The voids become maximum at the peak temperature $T_p$ and contract as the voids are cooled from the peak temperature $T_p$. After the solders 109 are solidified, the voids are confined in the solders 109 to form the hollow portions 200. That is, the hollow portions 200 contain gas such as carbon dioxide. The uncured thermosetting resin 108 has higher fluidity as compared to that shown in FIG. 3D, though a crosslinking reaction has proceeded, and is in a state that the degree of cure is low.

Figure 3F:
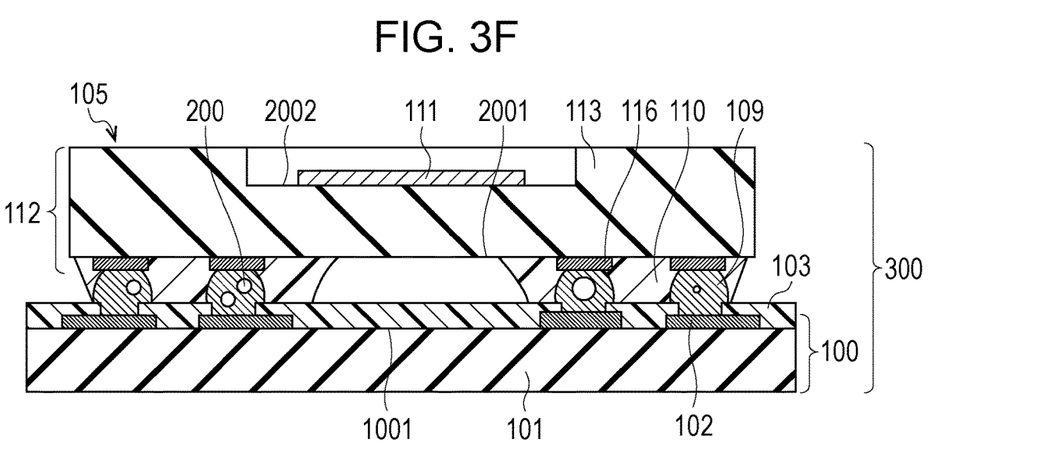
FIG. 3F is a schematic view illustrating the method for manufacturing the image pickup module shown in FIG. 1.

FIG. 3F shows a step of mainly curing the uncured thermosetting resin 108 after the step of solidifying the molten solder 107. In this step, gas such as carbon dioxide does not diffuse in the uncured thermosetting resin 108 because the solders 109 have the hollow portions 200 formed therein. The mainly cured thermosetting resin 110 is substantially solid and is in a state that the degree of cure is high. The temperature at which the uncured thermosetting resin 108 is mainly cured is lower than the melting point $T_M$ of the solder powder. The main curing step can be performed using a reflow oven for heating and cooling the solder paste 104. When the size of the reflow oven is small and therefore the time of the main curing step cannot be sufficiently ensured, the main curing step may be performed using another oven such as a batch oven after reflowing.

Through the above steps, the image pickup module 300 can be manufactured such that the hollow portions 200 are formed in the solders 109.

Temperature Profile

Figure 4:
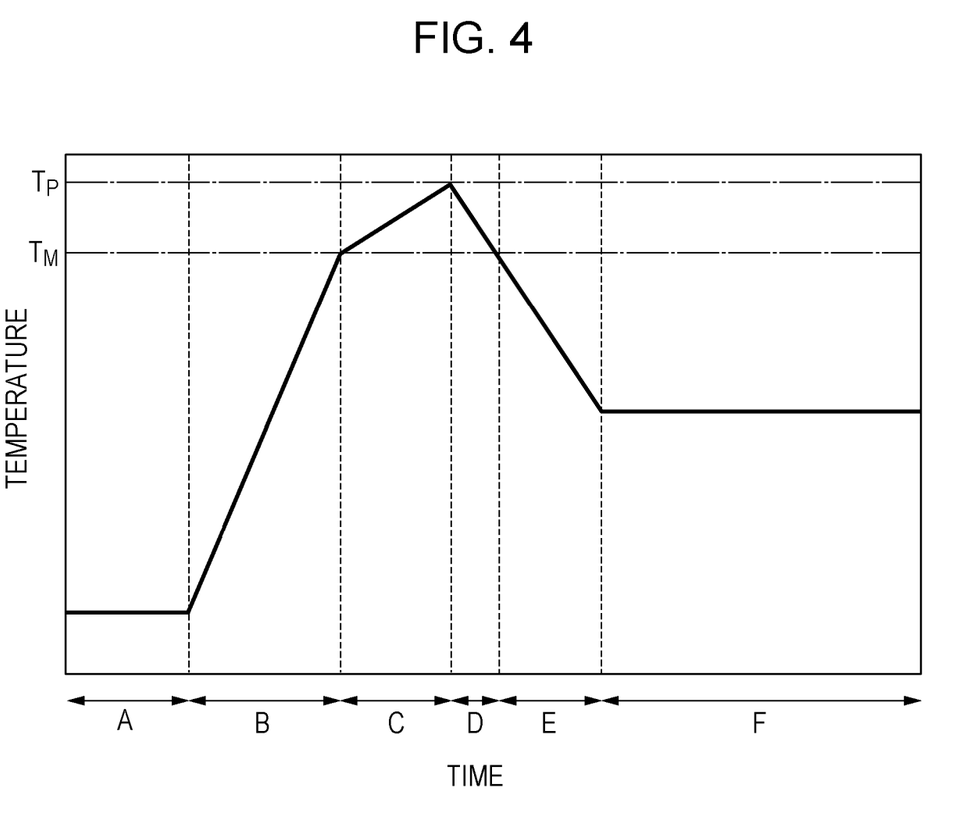
FIG. 4 is a graph showing a temperature profile in the method for manufacturing the image pickup module shown in FIG. 1.

Next, a temperature profile in the method for manufacturing the image pickup module 300 is described using FIG. 4.

After the step of providing the electronic component 105 on the printed wiring board 100 provided with the solder paste 104 is completed, the printed wiring board 100 provided with the electronic component 105 is charged into a reflow oven. Referring to FIG. 4, the horizontal axis represents the time and the vertical axis represents the temperature of the printed wiring board 100. Region A in FIG. 4 shows a state in which the printed wiring board 100 is charged into the reflow oven until heating is started. In Region A, the temperature is constant.

Next, in Region B, the temperature of the reflow oven is raised, whereby the printed wiring board 100 is heated such that the temperature of the printed wiring board 100 reaches the melting point $T_M$ of the solder powder. The heating rate in Region B is not particularly limited and is preferably, for example, 2.5° C./s or less. This is because when the heating rate is too high, the printed wiring board 100 may possibly be deformed. However, when the heating rate is too low, the throughput is poor. Therefore, the heating rate is preferably 0.3° C./s or more.

Next, in Region C, the temperature of the reflow oven is raised, whereby the printed wiring board 100 is heated such that the temperature of the printed wiring board 100 increases from the melting point $T_M$ of the solder powder to the peak temperature $T_p$. The peak temperature $T_p$ is not particularly limited and may be appropriately set. If the peak temperature $T_p$ is set extremely higher than the melting point $T_M$ of the solder powder, then the cure of the thermosetting resin proceeds. Therefore, even if the printed wiring board 100 is rapidly cooled in Region D below, the thermosetting resin may possibly be cured before the solder is solidified. Hence, the peak temperature $T_p$ is preferably 1.25 times or less the melting point $T_M$ of the solder powder.

The heating rate in Region C is not particularly limited, is preferably lower than the heating rate in Region B, and is, for example, 0.1° C./s to 1.0° C./s. More slowly melting the solder powder in Region C than in Region B enables the solder to be spread on the first lands 102 without any spaces. In Region C, the solder powder is melted and therefore the solder is in a liquid state. Since the solder powder is melted and is aggregated, the thermosetting resin is separated from the solder paste. On this occasion, the degree of cure of the thermosetting resin is 10% or less and the thermosetting resin is in a liquid state. A method for measuring the degree of cure of the thermosetting resin is described below.

In Region C, when the solder powder is melted, the oxide film covering the solder powder is reduced by flux contained in the solder paste and is removed. Gas such as carbon dioxide is generated together with the aggregation of the solder powder. The generated gas forms voids and the voids are expanded. The solder is maintained in a molten state at a temperature not lower than at least the melting point $T_M$ of the solder powder. On the other hand, the separated thermosetting resin has reduced viscosity and increased fluidity as compared to that in an unheated state (a degree of cure of about 15%). The gas generated together with the aggregation of the solder powder and the expanded voids break the thermosetting resin and the generated gas escapes into air. Since the broken thermosetting resin has high fluidity and therefore immediately blocks broken portions, the solder does not flow out. Since the thermosetting resin has high fluidity, the solder can be aggregated even though being separated once.

Next, in Region D, the temperature of the reflow oven is lowered, whereby the printed wiring board 100 is cooled from the peak temperature $T_p$ to a temperature lower than the melting point $T_M$ of the solder powder. The printed wiring board 100 is cooled to a temperature lower than the melting point $T_M$ of the solder powder, whereby the solder is solidified and the first lands 102 are electrically and mechanically bonded to the second lands 116 with the solder. When the solder is solidified, the voids are confined in the solders 109 to form the hollow portions 200. The percentage of the hollow portions 200 in the solders 109 can be controlled by the cooling rate in Region D. Reducing the cooling rate increases the percentage of the hollow portions 200 and increasing the cooling rate reduces the percentage of the hollow portions 200. The cooling rate in Region D is not particularly limited, is preferably higher than the heating rate in Region C, and is, for example, 0.4° C./s or more. The cooling rate in Region D is more preferably 1.3 times or more higher than the heating rate in Region C. From the viewpoint of controlling the grain size of solder to a small level, the cooling rate in Region D is more preferably 2.0 times or more higher than the heating rate in Region C.

In Region D, a crosslinking reaction of the thermosetting resin proceeds slightly and the degree of cure (hardness) thereof increases gradually. In this embodiment, the sum of the times of Regions C and D, in which the temperature exceeds the melting point $T_M$ of the solder powder, is set less than the time taken to cure the thermosetting resin. That is, before the thermosetting resin is cured, the solder is solidified. The fact that the thermosetting resin has been cured means that the degree of cure of the thermosetting resin is 50% or more. In a state in which the degree of cure thereof is 50% or more, the fluidity of the thermosetting resin is low and therefore portions of the thermosetting resin broken by the voids as described above cannot be blocked. Hence, in the state in which the degree of cure thereof is 50% or more, if the thermosetting resin is broken by the expansion or the like of gas and the voids in a state in which the solder is melted, then solder flows out of broken portions, adjacent pieces of the solder are short-circuited, and a bond failure occurs.

In Region D, the degree of cure of the thermosetting resin is preferably 30% or less. When the degree of cure of the thermosetting resin is 30% or less, the, the thermosetting resin is fluid. Therefore, even if the thermosetting resin is broken by the expansion or the like of gas and the voids in a state in which the solder is melted, broken portions can be blocked with the thermosetting resin. Hence, the solder is unlikely to flow out. From the viewpoint of maintaining the fluidity of the thermosetting resin high, the degree of cure of the thermosetting resin is preferably 10% or less.

Subsequently, in Region E, the temperature of the reflow oven is further lowered. In Region E, the solder is in a solidified state, the crosslinking reaction of the thermosetting resin proceeds subsequently to Region D, and the degree of cure (hardness) thereof increases gradually. In Region E, the degree of cure of the thermosetting resin is preferably 40% or less and more preferably 20% or less.

Subsequently, in Region F, the crosslinking reaction of the thermosetting resin is allowed to proceed in such a manner that the temperature of the reflow oven is held constant and the temperature of the printed wiring board 100 is adjusted to a temperature lower than the melting point $T_M$ of the solder powder, whereby the thermosetting resin is mainly cured. The mainly cured thermosetting resin has a degree of cure of 90% or more and a Vickers hardness of 17 Hv or more. When the Vickers hardness is 17 Hv or more, the bond strength is sufficient. Increasing the temperature in Region F enables the thermosetting resin to be mainly cured in a short time. Therefore, the temperature in Region F is preferably 0.8 times to 0.95 times the melting point $T_M$ of the solder powder. Referring to FIG. 4, the temperature of the reflow oven is maintained constant. The temperature of the reflow oven need not be maintained constant. However, reaction heterogeneity in the image pickup module 300 can be reduced in such a manner that the crosslinking reaction of the thermosetting resin is allowed to proceed at a constant temperature over a sufficient time.

The step of mainly curing the uncured thermosetting resin may be performed in an oven different from the reflow oven. When the printed wiring board 100 or the electronic component 105 is large, the distribution of temperature is large and therefore a preheating region may be placed in the course of heating once.

In accordance with a method for manufacturing an image pickup module according to the present disclosure, an image pickup module including hollow portions in solder can be provided by controlling a temperature profile during reflowing without performing a special step such as a pressurizing step or an atmosphere-controlling step.

Degree of Cure of Thermosetting Resin

Next, a method for evaluating the degree of cure of the thermosetting resin is described.

The degree of cure of the thermosetting resin can be evaluated with, for example, a rigid-body pendulum-type physical properties testing machine (rheometer). In particular, the following method is used: a method in which the degree of cure the thermosetting resin is calculated from the influence of a rigid-body pendulum on free damped oscillation in association with the change in degree of cure of the thermosetting resin. The rigid-body pendulum-type physical properties testing machine used may be a common one and may be, for example, RPT-3000W available from A&D Company, Limited or the like.

Figure 5:
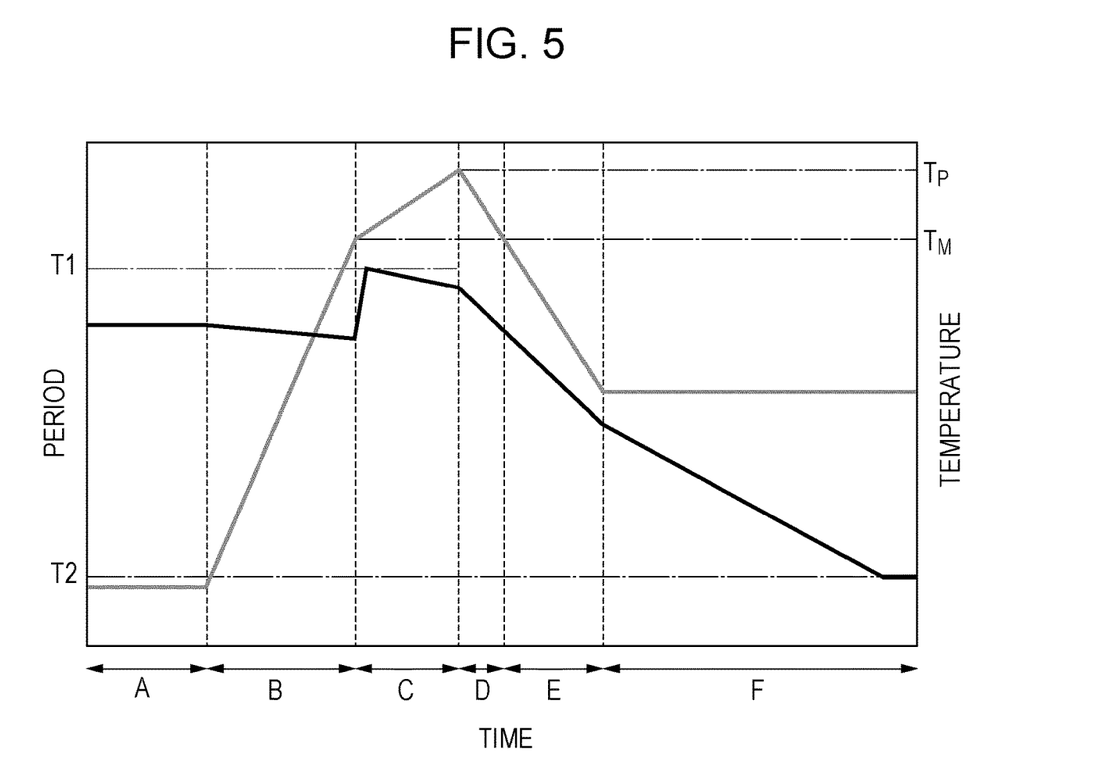
FIG. 5 is a graph showing the profile of the degree of cure of a thermosetting resin used in the method for manufacturing the image pickup module shown in FIG. 1.

FIG. 5 is a graph obtained by superimposing the variation profile of the free damped oscillation of a rigid-body pendulum by the thermosetting resin on the temperature profile shown in FIG. 4. Referring to FIG. 5, a gray line represents the temperature profile and a black line represents the oscillation period of the rigid-body pendulum.

In Region A, since the temperature of the printed wiring board 100 is constant, the degree of cure of thermosetting resin does not vary and therefore the oscillation period of the rigid-body pendulum is constant. On this occasion, the thermosetting resin is in a so-called uncured state before the curing reaction and is highly fluid. Therefore, the thermosetting resin is partially liquid.

Subsequently, in Region B, since the temperature of the printed wiring board 100 is raised, the curing reaction of the thermosetting resin in the solder paste proceeds gradually and therefore the oscillation period of the rigid-body pendulum becomes slightly short. That is, the fluidity of the thermosetting resin tends to decrease.

Subsequently, in Region C, the temperature of the printed wiring board 100 exceeds the melting point $T_M$ of the solder powder to reach the peak temperature $T_p$. Since the temperature of the printed wiring board 100 exceeds the melting point $T_M$ of the solder powder, the solder powder is melted and the molten solder is aggregated and is spread with respect to the thermosetting resin in the solder paste. Incidentally, the crosslinking reaction has begun partly in the thermosetting resin. On this occasion, the oscillation period of the rigid-body pendulum reaches the longest period T1. The degree of cure of the thermosetting resin on this occasion is set to 0%.

Subsequently, in Region D, the temperature of the printed wiring board 100 decreases from the peak temperature $T_p$ to the melting point $T_M$ of the solder powder. In this region, since the temperature of the printed wiring board 100 is maintained higher than the melting point $T_M$ of the solder powder, the solder and the thermosetting resin remain separated from each other, though the solder powder remains in a liquid state. Therefore, as the crosslinking reaction of the thermosetting resin proceeds, the oscillation period of the rigid-body pendulum becomes shorter than that in Region C. However, the oscillation period of the rigid-body pendulum does not become shorter than that in next Region E because the solder and the thermosetting resin interact with each other. Incidentally, when the peak temperature $T_p$ is too high as described above, it takes a long time to reduce the temperature of the printed wiring board 100 to the melting point $T_M$ of the solder powder and therefore the oscillation period of the rigid-body pendulum becomes shorter. If it takes a long time to reduce the temperature of the printed wiring board 100 to the melting point $T_M$ of the solder powder, then the degree of cure of the thermosetting resin may possibly reach 50% or more.

Subsequently, in Region E, the printed wiring board 100 is cooled from the melting point $T_M$ of the solder powder. In this region, since the solder is solidified, the solder and the thermosetting resin do not interact with each other. Therefore, as the crosslinking reaction of the thermosetting resin proceeds, the oscillation period of the rigid-body pendulum becomes shorter than that in Region D. In this region, if it takes a long time to reduce the temperature of the printed wiring board 100, then the oscillation period of the rigid-body pendulum becomes shorter. Thus, if it takes a long time to reduce the temperature of the printed wiring board 100, then the degree of cure of the thermosetting resin may possibly reach 50% or more.

In final Region F, the printed wiring board 100 is maintained constant at the melting point $T_M$ of the solder powder and therefore the crosslinking reaction of the thermosetting resin continues to proceed; hence, the oscillation period of the rigid-body pendulum becomes shorter than that in Region E. Finally, the crosslinking reaction of the thermosetting resin is completed and the oscillation period of the rigid-body pendulum becomes constant at T2. In this state, the thermosetting resin is in a completely solid state. Therefore, the degree of cure of the thermosetting resin on this occasion is set to 100%.

The method for evaluating the degree of cure of the thermosetting resin using the rigid-body pendulum-type rheometer has been described above. The degree of cure may be appropriately may be defined from the relationship between the amount of given heat and the degree of cure or hardness of the thermosetting resin by a thermal analysis method such as DSC or using a device such as a nanoindenter.

EXAMPLES

The present disclosure is further described below in detail with reference to examples. In advance of the examples, an evaluation method is described.

Method For Evaluating Image Pickup Module

Vickers Hardness of Thermosetting Resin

First, an image pickup module is disassembled and five pieces of a thermosetting resin are taken out. Ten portions of each thermosetting resin piece taken out are measured for Vickers hardness with a test force of 0.01 N using a Vickers hardness tester (a micro-hardness tester, HM-102, available from Mitutoyo Corporation) and the average of measurements thereof is defined as the Vickers hardness.

Grain Size of Solder

First, an image pickup module is disassembled and two pieces of solder are taken out. Images are taken from eight portions of each solder piece taken out using a scanning electron microscope, JSM-5600LV, available from JEOL Ltd. The images are taken from a junction of the solder and a surface perpendicular to the junction. The obtained images are binarized, followed by image processing, whereby the equivalent circle diameters of 50 or more grains are calculated. The equivalent circle diameters are number-averaged, whereby the grain size of solder is determined.

State of Solder and Hollow Portion

An image pickup module is observed for the joint state of solder under an electronic component in a surface direction in which the electronic component is mounted using a transmission X-ray inspection system, TUX-3200, available from Mars Tohken Solution Co., Ltd., whereby whether pieces of solder are in contact with each other (electrically shorted) is evaluated. An X-ray source used was an open-type one and transmission observation is performed under conditions including a tube voltage of 80 kV and a tube current of 200 µA. A hollow portion and solder are different in contrast. The percentage of the hollow portion is calculated in such a manner that the area of the solder and the area of the hollow portion are calculated using an image taken under the above conditions.

Joint State of Thermosetting Resin

The appearance of an image pickup module is visually inspected from a surface perpendicular to a junction of solder and is inspected from a photograph image. An electronic component is stripped off and the appearance thereof is visually inspected and is inspected from an image taken using an optical microscope.

Example 1

An image pickup module was manufactured by the manufacturing method described with reference to FIG. 3. Heating and cooling were performed using the temperature profile described with reference to FIG. 4.

As shown in FIG. 3A, first lands were formed on a printed wiring board. A solder resist was formed on a first surface of the printed wiring board so as to partly cover the first lands. Openings for connecting an electronic component which was a mounting object were formed in the solder resist so as be located on the first lands. The first lands were exposed in the openings.

The printed wiring board included an insulating substrate made of FR-4 and had an outside size of 50.0 mm×50.0 mm. The first lands were made of copper, had a diameter of 1.0 mm, and were arranged at a pitch of 1.6 mm in a grid pattern. The number of the first lands was 300. The solder resist has a thickness of 0.02 mm.

Next, as shown in FIG. 3B, a solder paste was applied to the printed wiring board by screen printing so as to cover the first lands. A printing plate with a thickness of 0.02 mm was used for screen printing.

The solder paste contained a thermosetting resin which was a bisphenol-A epoxy resin, a curing agent reacting therewith, and a solder powder. The solder powder had a melting point of 139° C., a tin-58 bismuth eutectic composition, and an average particle size of 40 µm. The content of the solder powder in the solder paste was 40% by volume, the remainder being the thermosetting resin, the curing agent, and a flux component that was added in a slight amount for the purpose of ensuring solderability.

Next, as shown in FIG. 3C, the electronic component was mounted on the printed wiring board provided with the solder paste using a mounter, which is not shown. The electronic component included an LGA-type image sensor. The bottom surface of the electronic component was provided with second lands. The second lands were mounted at positions corresponding to the first lands of the bonded printed wiring board. The electronic component was mounted on the printed wiring board in such a manner that connection terminals for LGAs were soldered to the first lands, which were placed on the insulating substrate. The electronic component included an insulating substrate made of an alumina ceramic.

The electronic component had a second surface with an area of 900 mm$^2$, the total area of the second lands was 150 mm$^2$, and the number of effective terminal was 300. The area surrounded by the innermost circumference of the second lands was 180 mm$^2$ and the area surrounded by the outermost circumference of the openings was 180 mm$^2$. The second lands, which were used to connect the electronic component, were plated electrodes made of Au, Ni, or the like.

The printed wiring board provided with the electronic component was charged into a reflow oven and was reflow-heated (Regions A and B in FIG. 4). On this occasion, in Region B, the heating rate was 1° C./s.

Heating was further continued and the printed wiring board was heated such that the temperature of the printed wiring board reached a peak temperature $T_p$ higher than the melting point $T_M$ of the solder powder, the peak temperature $T_p$ being 160° C. (1.15 times the melting point $T_M$ of the solder powder), whereby solder in the solder paste was melted. On this occasion, as shown in FIG. 3D, the solder in the solder paste was melted and was aggregated and molten solder in a liquid state and a thermosetting resin 108 were separated from each other (Region C in FIG. 4). On this occasion, in Region C, the heating rate was 0.5° C./s.

After the molten solder, which was in a liquid state, and the thermosetting resin were separated, the temperature of the printed wiring board was reduced from the peak temperature $T_p$ to the melting point $T_M$ of the solder powder, whereby the solder was solidified as shown in FIG. 3E (Region D in FIG. 4). The solder was solidified and hollow portions were formed in the solder. On this occasion, in Region D, the cooling rate was 2° C./s. In Regions C and D, the maximum degree of cure of the thermosetting resin was 10%. That is, before the degree of cure of the thermosetting resin reached 50% and the thermosetting resin was cured, the solidification of the solder was completed.

Subsequently, cooling was continued at the same cooling rate as that in Region D, whereby the printed wiring board was cooled to 120° C. (Region E in FIG. 4).

The thermosetting resin was mainly cured in such a manner that the thermosetting resin was maintained constant at 120° C. for 20 minutes, whereby the image pickup module was obtained as shown in FIG. 3F.

Example 2

Example 2 is different in temperature profile from Example 1. A manufacturing method is described with emphasis on different portions.

An electronic component was mounted on a printed wiring board, was reflow-heated, and was treated in the same manner as that described in Example 1 until Regions A and B in FIG. 4. Therefore, in Region B, the heating rate was 1° C./s.

Heating was further continued and the printed wiring board was heated such that the temperature of the printed wiring board reached a peak temperature $T_p$ higher than the melting point $T_M$ of a solder powder, the peak temperature $T_p$ being 160° C., whereby solder in a solder paste was melted. On this occasion, as shown in FIG. 3D, the solder in the solder paste was melted and was aggregated and molten solder in a liquid state and a thermosetting resin were separated from each other (Region C in FIG. 4). On this occasion, in Region C, the heating rate was 0.3° C./s.

After the molten solder, which was in a liquid state, and the thermosetting resin were separated, the temperature of the printed wiring board was reduced from the peak temperature $T_p$ to the melting point $T_M$ of the solder powder, whereby the solder was solidified as shown in FIG. 3E (Region D in FIG. 4). The solder was solidified and hollow portions were formed in the solder. On this occasion, in Region D, the cooling rate was 0.4° C./s. In Regions C and D, the maximum degree of cure of the thermosetting resin was 20%. That is, before the degree of cure of the thermosetting resin reached 50% and the thermosetting resin was cured, the solidification of the solder was completed.

Subsequently, cooling was continued at the same cooling rate as that in Region D, whereby the printed wiring board was cooled to 110° C. (Region E in FIG. 4).

The thermosetting resin was mainly cured in such a manner that the thermosetting resin was maintained constant at 110° C. for 30 minutes, whereby an image pickup module was obtained in Example 2 as shown in FIG. 3F.

Evaluation of Image Pickup Modules Manufactured in Examples 1 and 2

Vickers Hardness of Thermosetting Resin

The Vickers hardness of the thermosetting resin cured in Example 1 was 20 Hv. The Vickers hardness of the thermosetting resin cured in Example 2 was 17 Hv.

Grain Size of Solder

The grain size of the solder used in Example 1 was 3 μm. The grain size of the solder used in Example 2 was 12 μm.

State of Solder, Hollow Portions, and Thermosetting Resin

The state of the solder and hollow portions of the image pickup module manufactured in each of Examples 1 and 2 was observed with an X-ray transmission system.

The solder of the image pickup module manufactured in Example 1 had 5% by area to 25% by area of the hollow portions. The maximum length Ls of the solder was 1.0 mm, the maximum length Lp of the hollow portions was 0.3 mm, and the ratio Lp/Ls was 30%. There was no fact that the solder broke the thermosetting resin to flow out, no fact that pieces of the solder were connected to each other under the electronic component, or no abnormality such as electrical shorting. An appearance inspection confirmed that the solder was covered by and reinforced with the thermosetting resin. An appearance inspection after disassembling by stripping off the electronic component confirmed that the thermosetting resin was attached to a lower portion of the electronic component and the electronic component was reinforced.

The solder of the image pickup module manufactured in Example 2 had 5% by area to 50% by area of the hollow portions. The maximum length Ls of the solder was 1.0 mm, the maximum length Lp of the hollow portions was 0.5 mm, and the ratio Lp/Ls was 50%. Example 2 was lower in cooling rate than Example 1 and the time for which the solder was melted was long. Therefore, the number of the hollow portions in Example 2 was larger than that in Example 1. However, there was no fact that the solder broke the thermosetting resin to flow out, no fact that pieces of the solder were connected to each other under the electronic component, or no abnormality such as electrical shorting. An appearance inspection confirmed that the solder was covered by and reinforced with the thermosetting resin. An appearance inspection after disassembling by stripping off the electronic component confirmed that the thermosetting resin was attached to a lower portion of the electronic component and the electronic component was reinforced.

Others

In the image pickup module manufactured in each of Examples 1 and 2, although the electronic component was equipped with an image pickup element, the amount of thermal deformation was small because a main curing step was performed at a temperature not higher than the melting point of the solder; hence, the optical performance of a built-in CMOS image sensor could be guaranteed.

Comparative Example 1

Comparative Example 1 is different in temperature profile from Example 1. A manufacturing method is described with emphasis on different portions.

An electronic component was mounted on a printed wiring board, was reflow-heated, and was treated in the same manner as that described in Example 1 until Regions A and B in FIG. 4. Therefore, in Region B, the heating rate was 1° C./s.

Heating was further continued and the printed wiring board was heated such that the temperature of the printed wiring board reached a peak temperature $T_p$ higher than the melting point $T_M$ of a solder powder, the peak temperature $T_p$ being 180° C. (1.29 times the melting point $T_M$ of the solder powder), whereby solder in a solder paste was melted. On this occasion, as shown in FIG. 3D, the solder in the solder paste was melted and was aggregated and liquid solder and a thermosetting resin were separated from each other (Region C in FIG. 4). On this occasion, in Region C, the heating rate was 0.5° C./s.

After the liquid solder and the thermosetting resin were separated, the temperature of the printed wiring board was reduced from the peak temperature $T_p$ to the melting point $T_M$ of the solder powder, whereby the solder was solidified as shown in FIG. 3E (Region D in FIG. 4). On this occasion, in Region D, the cooling rate was 0.5° C./s. In Regions C and D, the maximum degree of cure of the thermosetting resin was 50%. That is, after the degree of cure of the thermosetting resin reached 50%, the solidification of the solder was completed.

Subsequently, cooling was continued at the same cooling rate as that in Region D, whereby the printed wiring board was cooled to 110° C. (Region E in FIG. 4).

The thermosetting resin was mainly cured in such a manner that the thermosetting resin was maintained constant at 110° C. for 30 minutes, whereby an image pickup module was obtained in Comparative Example 1.

Comparative Example 2

Comparative Example 2 is also different in temperature profile from Example 1. A manufacturing method is described with emphasis on different portions.

An electronic component was mounted on the printed wiring board, was reflow-heated, and was treated in the same manner as that described in Example 1 until Regions A and B in FIG. 4. Therefore, in Region B, the heating rate was 0.5° C./s.

Heating was further continued and the printed wiring board was heated such that the temperature of the printed wiring board reached a peak temperature $T_p$ higher than the melting point $T_M$ of a solder powder, the peak temperature $T_p$ being 165° C., whereby solder in a solder paste was melted. On this occasion, as shown in FIG. 3D, the solder in the solder paste was melted and was aggregated and molten solder and a thermosetting resin were separated from each other (Region C in FIG. 4). On this occasion, in Region C, the heating rate was 0.5° C./s.

After the liquid solder and the thermosetting resin were separated, the temperature of the printed wiring board was reduced from the peak temperature $T_p$ to the melting point $T_M$ of the solder powder, whereby the solder was solidified as shown in FIG. 3E (Region D in FIG. 4). On this occasion, in Region D, the cooling rate was 0.25° C./s. In Regions C and D, the maximum degree of cure of the thermosetting resin was 55%. That is, after the degree of cure of the thermosetting resin reached 55%, the solidification of the solder was completed.

Subsequently, cooling was continued at the same cooling rate as that in Region D, whereby the printed wiring board was cooled to 110° C. (Region E in FIG. 4).

The thermosetting resin was mainly cured in such a manner that the thermosetting resin was maintained constant at 110° C. for 30 minutes, whereby an image pickup module was obtained in Comparative Example 2.

Comparative Example 3

Comparative Example 3 is also different in temperature profile from Example 1. A manufacturing method is described with emphasis on different portions.

An electronic component was mounted on a printed wiring board, was reflow-heated, and was treated in the same manner as that described in Example 1 until Regions A and B in FIG. 4. Therefore, in Region B, the heating rate was 0.5° C./s.

Heating was further continued and the printed wiring board was heated such that the temperature of the printed wiring board reached a peak temperature $T_p$ higher than the melting point $T_M$ of a solder powder, the peak temperature $T_p$ being 160° C., whereby solder in a solder paste was melted. On this occasion, as shown in FIG. 3D, the solder in the solder paste was melted and was aggregated and molten solder and a thermosetting resin were separated from each other (Region C in FIG. 4). On this occasion, in Region C, the heating rate was 0.5° C./s.

After the liquid solder and the thermosetting resin were separated, the peak temperature $T_p$, 160° C., was maintained for six minutes. Thereafter, the temperature of the printed wiring board was reduced from the peak temperature $T_p$ to the melting point $T_M$ of the solder powder, whereby the solder was solidified as shown in FIG. 3E (Region D in FIG. 4). On this occasion, in Region D, the cooling rate was 0.5° C./s. In Regions C and D, the maximum degree of cure of the thermosetting resin was 70%. That is, after the degree of cure of the thermosetting resin reached 70%, the solidification of the solder was completed.

Subsequently, cooling was continued at the same cooling rate as that in Region D, whereby the printed wiring board was cooled to 110° C. (Region E in FIG. 4).

The thermosetting resin was mainly cured in such a manner that the thermosetting resin was maintained constant at 110° C. for 30 minutes, whereby an image pickup module was obtained in Comparative Example 3.

Evaluation of Image Pickup Modules Obtained in Comparative Examples 1 to 3

Vickers Hardness of Thermosetting Resins

The Vickers hardness of the thermosetting resin cured in Comparative Example 1 was 16 Hv. The Vickers hardness of the thermosetting resin cured in Comparative Example 2 was 15 Hv. The Vickers hardness of the thermosetting resin cured in Comparative Example 3 was 14 Hv.

Grain Size of Solder

The grain size of the solder used in Comparative Example 1 was 12 µm. The grain size of the solder used in Comparative Example 2 was 20 µm. The grain size of the solder used in Comparative Example 3 was 3 µm.

State of Solder, Hollow Portions, and Thermosetting Resin

The state of the solder and hollow portions of the image pickup module obtained in each of Comparative Examples 1 to 3 was observed with an X-ray transmission system.

A hollow portion in the solder of the image pickup module obtained in Comparative Example 1 reached the interface between the solder and resin. Therefore, solder bridges between adjacent pieces of the solder were observed at a plurality of places. In inspection by electrical check, an electrical connection failure was observed. The maximum length Ls of the solder was 1.1 mm and the maximum length Lp of the hollow portion was large, 0.7 mm. The presence of more than 50% by area of a hollow portion was observed. Therefore, it is conceivable that a system against drop impact is insufficient.

A hollow portion in the solder of the image pickup module obtained in Comparative Example 2 reached the interface between the solder and resin. Therefore, solder bridges between adjacent pieces of the solder were observed at a plurality of places. In inspection by electrical check, an electrical connection failure was observed. The solder was not circular but irregular and the maximum length Ls thereof was 1.3 mm. The maximum length Lp of the hollow portion was large, 0.7 mm. The presence of more than 50% by area of a hollow portion was observed. Therefore, it is conceivable that a system against drop impact is insufficient.

A hollow portion in the solder of the image pickup module obtained in Comparative Example 3 reached the interface between the solder and resin. Therefore, solder bridges between adjacent pieces of the solder were observed at a plurality of places. In inspection by electrical check, an electrical connection failure was observed. The solder was not circular but irregular and the maximum length Ls thereof was 1.3 mm. The maximum length Lp of the hollow portion was large, 0.9 mm. The presence of more than 50% by area of a hollow portion was observed. Furthermore, many places in which no thermosetting resin was present around solder were observed. Therefore, it is conceivable that a system against drop impact is insufficient.

Other Embodiments

In the above-mentioned embodiments, the image pickup device and a semiconductor device for image processing have been cited as examples of the electronic device. The present disclosure is applicable to, for example, other electronic devices such as memory integrated circuits (ICs) and power supply ICs.

The present disclosure is applicable to electronic devices other than semiconductor devices if the electronic devices include external terminals for BGAs or LGAs.

The digital camera 600 is cited as an example of the electronic device. The present invention is not limited to the digital camera 600 and is applicable to various electronic devices such as mobile communication devices.

According to the present disclosure, an appropriate amount of gas generated in a manufacturing process is confined in solder, whereby a hollow portion is formed in the solder. Therefore, the gas generated in the manufacturing process does not diffuse in any thermosetting resin; hence, an image pickup module in which no pieces of the solder are short-circuited can be provided. Furthermore, the solder has an appropriate amount of the hollow portion; hence, an image pickup module in which resistance to heat and resistance to drop impact can be both achieved can be provided.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-180426, filed Sep. 26, 2018 and No. 2019-140174, filed Jul. 30, 2019, which are hereby incorporated by reference herein in their entirety.

What is claimed is:

1. An image pickup module comprising:
a printed wiring board having a first surface provided with first lands;
an electronic component which includes an image pickup element and which has a second surface, provided with second lands, facing the first surface;
a plurality of solders, bonding the first lands to the second lands, at least one of the plurality of solders having a hollow portion; and
a thermosetting resin, in contact with the plurality of solders, bonding the printed wiring board to the electronic component,
wherein, as observed from the electronic component side or the print wiring board side in a transmission mode using an X-ray, a maximum value of an area of the hollow portion in at least one solder having the hollow portion is 50% or less of an area of the at least one solder having the hollow portion.

2. The image pickup module according to claim 1, wherein, as observed from the electronic component side or the print wiring board side in a transmission mode using an X-ray, a length of the hollow portion in the at least one solder having the hollow portion is 50% or less of a maximum length of the at least one solder having the hollow portion.

3. The image pickup module according to claim 2, wherein the maximum value of the length of the hollow portion is 0.5 mm or less.

4. The image pickup module according to claim 2, wherein, as observed from the electronic component side or the print wiring board side in a transmission mode using an X-ray, the length of the hollow portion in the at least one solder having the hollow portion is 10% or greater and 40% or less of the maximum length of the at least one solder having the hollow portion.

5. The image pickup module according to claim 1, wherein the grain size of the solder is 3μm to 12 μm in terms of number-average equivalent circle diameter.

6. The image pickup module according to claim 1, wherein the thermosetting resin has a Vickers hardness of 17 Hv or more.

7. The image pickup module according to claim 1, wherein the thermosetting resin is an epoxy resin.

8. The image pickup module according to claim 1, wherein the second surface of the electronic device has an area of 900 mm$^2$ or more.

9. An electronic device comprising:
a housing; and
an image pickup module placed in the housing,
wherein the image pickup module is the image pickup module according to claim 1.

10. The electronic device according to claim 9, wherein the electronic device is a camera.

11. The electronic device according to claim 9, wherein the electronic device is a mobile communication device.

12. The electronic device according to claim 9, further comprising a printed circuit board in the housing,
wherein the printed circuit board is to be electrically connected to the printed wiring board.

13. The electronic device according to claim 12, wherein the printed circuit board includes a digital signal processor and a printed wiring board on which the digital signal processor is to be mounted.

14. The image pickup module according to claim 1, wherein as observed from the electronic component side or the print wiring board side in a transmission mode using an X-ray, a maximum value of the area of the hollow portion in the at least one solder having the hollow portion is 5% or greater of the area of the at least one solder having the hollow portion.

15. The image pickup module according to claim 14, wherein as observed from the electronic component side or the print wiring board side in a transmission mode using an X-ray, the maximum value of the area of the hollow portion in the at least one solder having the hollow portion is 5% or greater and 25% or less of the area of the at least one solder having the hollow portion.

16. A method for manufacturing an image pickup module including a printed wiring board having a first surface provided with first lands; an electronic component which includes an image pickup element and which has a second surface, provided with second lands, facing the first surface; a plurality of solders, bonding the first lands to the second lands, having a hollow portion; and a thermosetting resin, in contact with the plurality of solders, bonding the printed wiring board to the electronic component, the method comprising:
providing a solder paste containing a solder powder and a thermosetting resin on the first lands;
providing the electronic component on the printed wiring board such that the second lands are located on the first lands;
heating the solder paste to a peak temperature $T_p$ higher than the melting point TM of the solder powder such that the solder powder is melted and the thermosetting resin is separated from the solder paste; and
solidifying the plurality of solders by cooling the solder from the peak temperature $T_p$ to a temperature lower than the melting point TM of the solder powder before the thermosetting resin is cured and forming a hollow portion in at least one of the plurality of solders.

17. The method according to claim 16, wherein the time taken to heat the solder paste from the melting point TM of the solder powder to the peak temperature $T_p$ is longer than the time taken to cool the plurality of solders from the peak temperature Tp to the melting point TM of the solder powder.

18. The method according to claim 17, wherein the time taken to heat the solder paste from the melting point TM of the solder powder to the peak temperature $T_p$ is 1.3 times or more the time taken to cool the plurality of solders from the peak temperature Tp to the melting point TM of the solder powder.

19. The method of claim 16, wherein the degree of cure of the thermosetting resin is 30% or less in solidifying the plurality of solders.

20. The method according to claim 16, wherein the degree of cure of the thermosetting resin is 10% or less in solidifying the plurality of solders.

21. The method according to claim 16, further comprising mainly curing the thermosetting resin at a temperature lower than the melting point $T_M$ of the solder powder after solidifying the plurality of solders.

22. The method according to claim 21, wherein the degree of cure of the thermosetting resin is 90% or more after mainly curing the thermosetting resin is completed.

23. An electronic device comprising:
a housing;
a printed wiring board arranged in the housing and having a first surface provided with first lands;
an electronic component arranged in the housing and having a second surface provided with second lands and facing the first surface;
a plurality of solders arranged in the housing, and bonding the first lands to the second lands, at least one of the plurality of solders having a hollow portion; and
resin arranged in the housing, in contact with the plurality of solders, and bonding the printed wiring board to the electronic component,
wherein, as observed from the electronic component side or the print wiring board side in a transmission mode using an X-ray with the housing being removed, a maximum value of an area of the hollow portion in the at least one solder having the hollow portion is 50% or less of an area of the at least one solder having the hollow portion.

24. The electronic device according to claim 23, wherein, as observed from the electronic component side or the print wiring board side in a transmission mode using an X-ray, a maximum value of a length of the hollow portion in the at least one solder having the hollow portion is 50% or less of a maximum length of the at least one solder having the hollow portion.

25. The electronic device according to claim 24, wherein the maximum value of the length of the hollow portion is 0.5 mm or less.

26. The electronic device according to claim 24, wherein, as observed from the electronic component side or the print wiring board side in a transmission mode using an X-ray with the housing being removed, the length of the hollow portion in the at least one solder having the hollow portion is 10% or greater and 40% or less of the maximum length of the at least one solder having the hollow portion.

27. The electronic device according to claim 23, wherein the grain size of the solder is 3 μm to 12 μm in terms of number-average equivalent circle diameter.

28. The electronic device according to claim 23, wherein the resin has a Vickers hardness of 17 Hv or more.

29. The electronic device according to claim 23,
wherein a solder resist including openings is arranged on the first surface of the printed wiring board,
wherein the first lands are arranged in the openings, and
wherein the resin bonds the solder resist to the electronic component.

30. The electronic device according to claim 23, wherein the electronic device is a mobile communication device.

31. The electronic device according to claim 23, further comprising a printed circuit board in the housing,
wherein the printed circuit board is to be electrically connected to the printed wiring board.

32. The electronic device according to claim 31, wherein the printed circuit board includes a digital signal processor and a printed wiring board on which the digital signal processor is to be mounted.

33. The electronic device according to claim 23, wherein as observed from the electronic component side or the print wiring board side in a transmission mode using an X-ray with the housing being removed, a maximum value of the area of the hollow portion in the at least one solder having the hollow portion is 5% or greater of the area of the at least one solder having the hollow portion.

34. The electronic device according to claim 33, wherein as observed from the electronic component side or the print wiring board side in a transmission mode using an X-ray with the housing being removed, the maximum value of the area of the hollow portion in the at least one solder having the hollow portion 5% or greater 25% or less of the area of the at least one solder having the hollow portion.

35. The electronic device according to claim 23, wherein the second surface of the electronic device has an area of 900 mm² or more.

* * * * *